(12) United States Patent
Vincent et al.

(10) Patent No.: US 12,288,927 B2
(45) Date of Patent: Apr. 29, 2025

(54) SEMICONDUCTOR DEVICE WITH LOW LOSS WAVEGUIDE INTERFACE AND METHOD THEREFOR

(71) Applicant: NXP USA, INC., Austin, TX (US)

(72) Inventors: Michael B. Vincent, Chandler, AZ (US); Giorgio Carluccio, Eindhoven (NL)

(73) Assignee: NXP USA, Inc., Austin, TX (US)

(*) Notice: Subject to any disclaimer, the term of this patent is extended or adjusted under 35 U.S.C. 154(b) by 544 days.

(21) Appl. No.: 17/452,091

(22) Filed: Oct. 25, 2021

(65) Prior Publication Data

US 2023/0127033 A1 Apr. 27, 2023

(51) Int. Cl.
  *H01Q 1/22*   (2006.01)
  *H01L 21/56*  (2006.01)
  *H01L 23/31*  (2006.01)
  *H01L 23/58*  (2006.01)

(52) U.S. Cl.
  CPC ......... *H01Q 1/2283* (2013.01); *H01L 21/568* (2013.01); *H01L 23/585* (2013.01); *H01L 23/3128* (2013.01)

(58) Field of Classification Search
  CPC .... H01Q 1/2283; H01Q 13/06; H01L 21/568; H01L 23/585; H01L 23/3128
  See application file for complete search history.

(56) References Cited

U.S. PATENT DOCUMENTS

| | | | |
|---|---|---|---|
| 8,247,889 B2 | 8/2012 | Liao et al. | |
| 8,916,421 B2 | 12/2014 | Gong et al. | |
| 9,531,052 B2* | 12/2016 | Dang | H01Q 1/48 |
| 9,704,780 B2 | 7/2017 | Marimuthu et al. | |
| 10,651,541 B1* | 5/2020 | Hayes | H01Q 21/064 |
| 11,133,273 B2 | 9/2021 | Vincent et al. | |
| 2009/0168249 A1* | 7/2009 | McCaslin | G11B 19/042 |
| | | | 360/245.3 |
| 2013/0049182 A1 | 2/2013 | Gong et al. | |
| 2013/0049217 A1 | 2/2013 | Gong et al. | |
| 2013/0127030 A1 | 5/2013 | Gong et al. | |
| 2013/0154091 A1 | 6/2013 | Wright et al. | |
| 2015/0262842 A1* | 9/2015 | Iijima | H01L 24/20 |
| | | | 257/664 |
| 2019/0109362 A1 | 4/2019 | Haroun et al. | |
| 2019/0279950 A1 | 9/2019 | Kim et al. | |
| 2019/0348746 A1* | 11/2019 | Gupta | H01Q 21/0006 |
| 2020/0021002 A1* | 1/2020 | Wojnowski | H01L 23/66 |
| 2020/0135670 A1* | 4/2020 | Hsu | H01Q 1/523 |

(Continued)

*Primary Examiner* — Fernando L Toledo
*Assistant Examiner* — Marshall Mu-Nuo Hatfield

(57) ABSTRACT

A method of forming a semiconductor device is provided. The method includes providing a radiating element structure and a semiconductor die. The radiating element structure includes a non-conductive substrate, a radiating element formed at a top side of the non-conductive substrate, and a conductive ring formed at the top side of the non-conductive substrate substantially surrounding the radiating element. The semiconductor die is interconnected with the radiating element by way of a conductive trace. An encapsulant encapsulates at least a portion of the radiating element structure. A top surface of the conductive ring exposed at a top surface of the encapsulant. A waveguide interface material is applied on at least a portion of the top surface of the encapsulant.

20 Claims, 15 Drawing Sheets

(56) References Cited

U.S. PATENT DOCUMENTS

| | | |
|---|---|---|
| 2021/0028131 A1 | 1/2021 | Zanati et al. |
| 2021/0183796 A1 * | 6/2021 | Mncent et al. |
| 2021/0218125 A1 * | 7/2021 | Ali .......................... H01Q 1/38 |
| 2021/0225719 A1 * | 7/2021 | Seler ................... H01L 21/4817 |

* cited by examiner

US 12,288,927 B2

SEMICONDUCTOR DEVICE WITH LOW LOSS WAVEGUIDE INTERFACE AND METHOD THEREFOR

BACKGROUND

Field

This disclosure relates generally to semiconductor device packaging, and more specifically, to a semiconductor device with low loss waveguide interface and method of forming the same.

Related Art

Today, there is an increasing trend to include radar systems in vehicles such as automobiles, trucks, buses, and the like in order to provide a driver with enhanced awareness of objects around the driver's vehicle. As the vehicle approaches objects (e.g. other cars, pedestrians, and obstacles) or as objects approach the vehicle, a driver cannot always detect the object and perform intervention actions needed to avoid a collision with the object. An automotive radar system mounted on a vehicle can detect the presence of objects including other vehicles in proximity to the vehicle and provide the driver with timely information so that the driver can perform possible intervention actions. However, such automotive radar system can present significant challenges in improving performance while minimizing impact to the cost of the vehicle.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device with a low loss waveguide interface. The semiconductor device includes a semiconductor die and one or more radiating element structures at least partially encapsulated with an encapsulant. Each of the one or more radiating element structures includes a radiating element and a conductive surrounding ring substantially surrounding the radiating element. A top portion of the surrounding rings of the radiating element structures is extended and exposed at a top surface of the encapsulant. A waveguide interface material is formed over the top surface of the semiconductor device such that a substantially contiguous conductive waveguide channel is formed surrounding respective radiating elements. When a waveguide structure is affixed to the semiconductor device, the substantially contiguous conductive waveguide channel extends from the one or more radiating element structures through the waveguide structure. By forming the substantially contiguous conductive waveguide channel in this manner, RF signal radiation is prevented from propagating laterally thus minimizing signal loss in the intended vertical signal propagation path.

Figure 1:
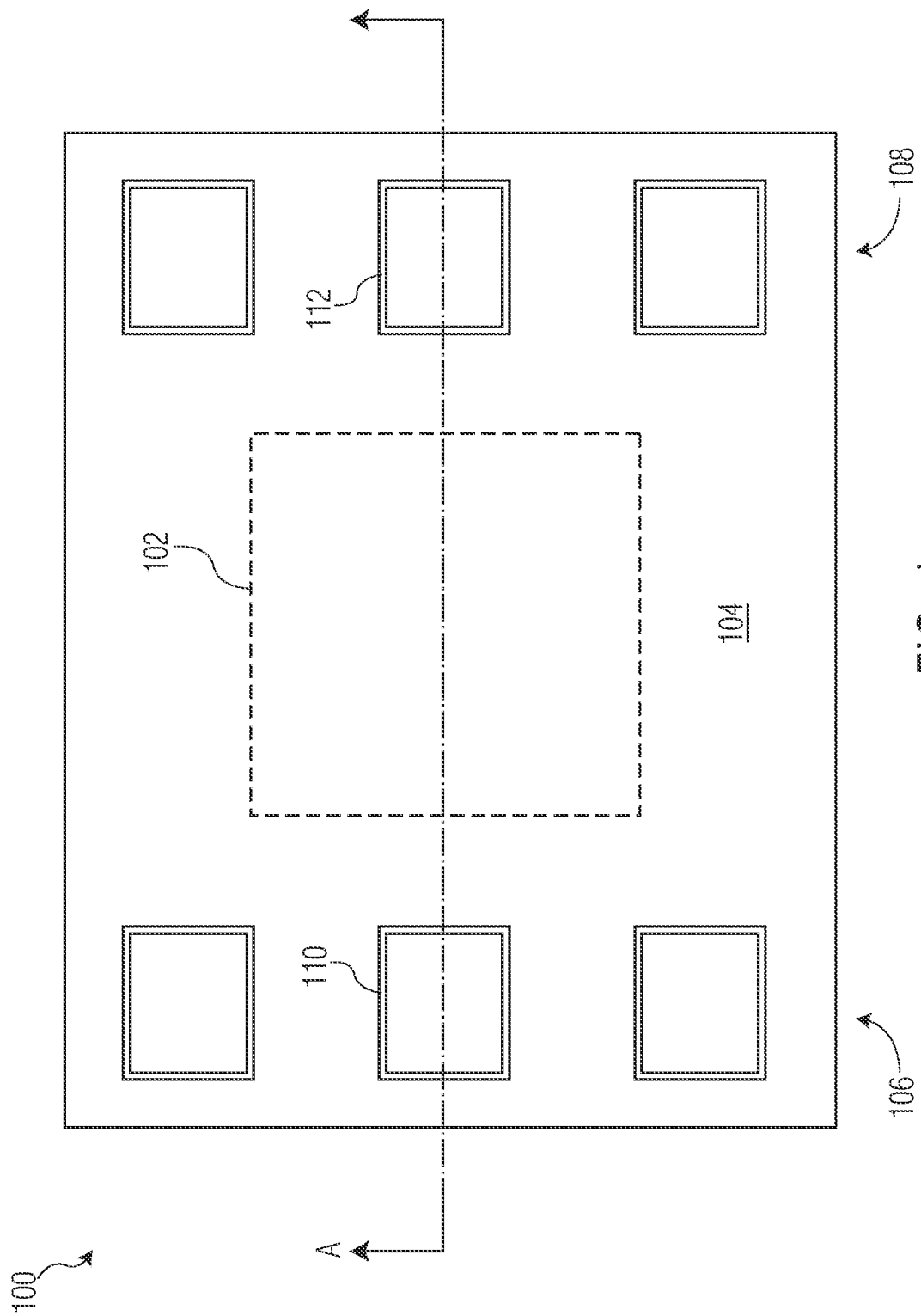
FIG. 1 illustrates, in a simplified top-side-up plan view, an example semiconductor device having a low loss waveguide interface at a stage of manufacture in accordance with an embodiment.

FIG. 1 illustrates, in a simplified top-side-up plan view, an example semiconductor device 100 having a low loss waveguide interface at a stage of manufacture in accordance with an embodiment. In this embodiment, the semiconductor device 100 includes a plurality of radiating element structures 106 and 108 encapsulated with an encapsulant 104 (e.g., epoxy molding compound) and an underlying semiconductor die 102 shown as dashed outline for reference. The group of radiating element structures 106 may be characterized as transmitter (TX) radiating element structures and the group of radiating element structures 108 may be characterized as receiver (RX) radiating element structures, for example. Each of the TX radiating element structures 106 include a conductive (e.g., metal) underlying radiating element (not shown) and conductive (e.g., metal) surrounding ring 110 exposed at the top surface of the encapsulant 104 and each of the RX radiating element structures 108 include an underlying radiating element and surrounding ring 112 exposed at the top surface of the encapsulant 104. Each of the conductive surrounding rings 110 and 112 is configured to substantially surround a respective radiating element. The number and arrangement of the TX and RX radiating element structures in this embodiment are chosen for illustration purposes. In other embodiments, the semiconductor device 100 may include any number of TX and RX radiating element structures, arranged accordingly. Simplified cross-sectional views of the example semiconductor device 100 taken along line A-A at stages of manufacture are depicted in FIG. 2 through FIG. 7.

Figure 2:
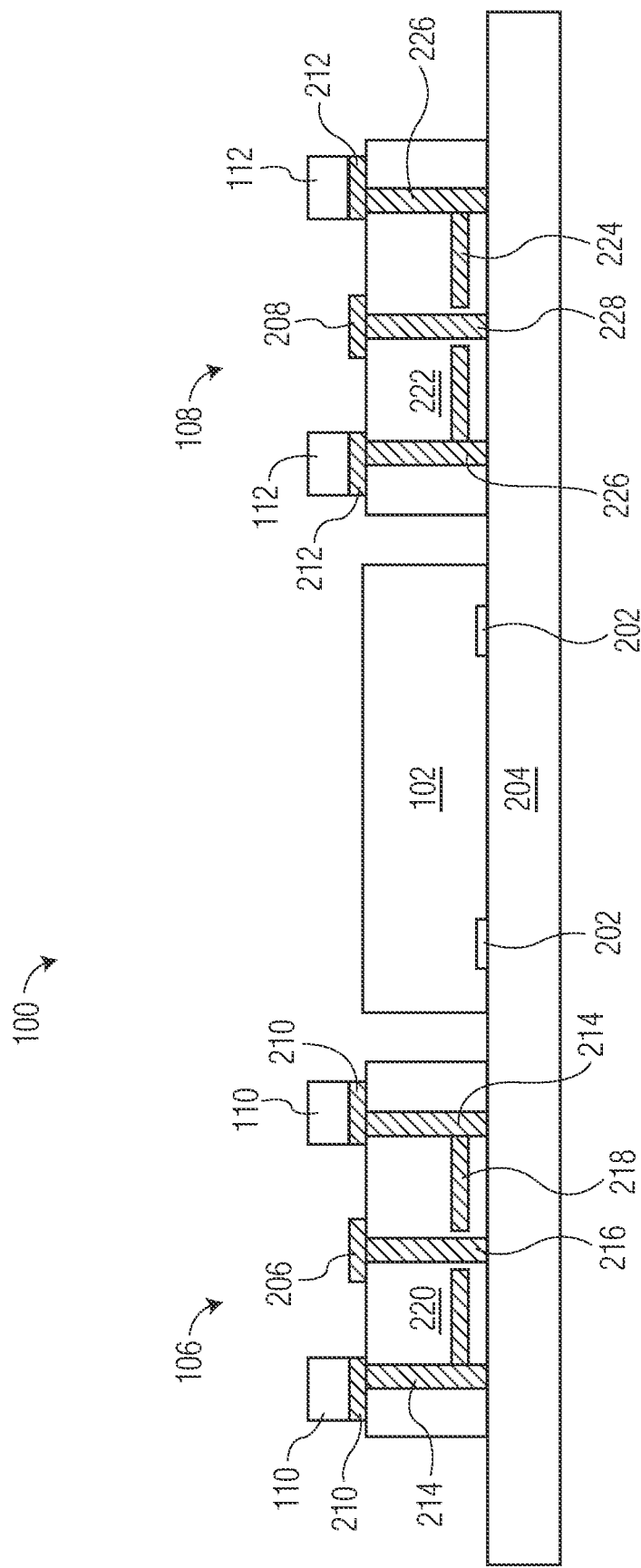
FIG. 2 through FIG. 7 illustrate, in simplified cross-sectional views, the example semiconductor device at stages of manufacture in accordance with an embodiment.

FIG. 2 illustrates, in a simplified cross-sectional view, the example semiconductor device 100 taken along line A-A at a stage of manufacture in accordance with an embodiment. At this stage, the semiconductor device 100 includes the semiconductor die 102 and the radiating element structures 106 and 108 placed on a carrier substrate 204. The carrier substrate 204 is configured and arranged to provide a temporary structure for placement of the semiconductor die 102 and the radiating element structures 106 and 108 during encapsulation at a subsequent stage of manufacture, for example. In this embodiment, the radiating element structures 106 and 108 are configured for propagation of RF signals such as radar, Wi-Fi, UWB, 5G and 6G signals.

The radiating element structures 106 and 108 include conductive radiating elements (e.g., signal launcher, antenna) 206 and 208 with conductive surrounding rings 210 and 212 formed at a top surface of non-conductive substrates 220 and 222, respectively. A bottom surface of the radiating element structures 106 and 108 is placed on the carrier substrate 204. As depicted in FIG. 2, the surrounding rings of the radiating element structures 106 and 108 include conductive (e.g., metal) extended portions 110 and 112 formed on conductive base portions 210 and 212. The conductive extended portions 110 and 112 are configured to increase the effective height of the surrounding rings, for example.

The radiating element structures 106 and 108 further include horizontal conductive (e.g., metal) plates 218 and 224 that serve as signal reflectors interconnected with respective surrounding rings 210 and 212 by way of conductive vias 214 and 226. The conductive vias 214 and 226 are configured and arranged to form a vertical conductive structure (e.g., wall, fence) substantially surrounding each of the respective radiating elements 206 and 208 and interconnecting vias 216 and 228. The substrates 220 and 222 may be formed from suitable non-conductive materials such as laminate (e.g., Bismaleimide Triazine, FR4), ceramic, glass, and the like. In this embodiment, the signal reflectors 218 and 224 are located at a major side of the substrates 220 and 222 opposite of the respective radiating elements 206 and 208.

The semiconductor die 102 has an active side (e.g., major side having circuitry) and a backside (e.g., major side opposite of the active side). The semiconductor die 102 includes bond pads 202 formed at the active side and configured for connection to the respective radiating elements 206 and 208 by way of interconnecting vias 216 and 228, for example. In this embodiment, semiconductor die 102 is configured in an active-side-down orientation with the active side placed on the carrier substrate 204. The semiconductor die 102 may be formed from any suitable semiconductor material, such as silicon, germanium, gallium arsenide, gallium nitride, and the like. The semiconductor die 102 further includes any digital circuits, analog circuits, RF circuits, memory, processor, the like, and combinations thereof at the active side.

Figure 3:
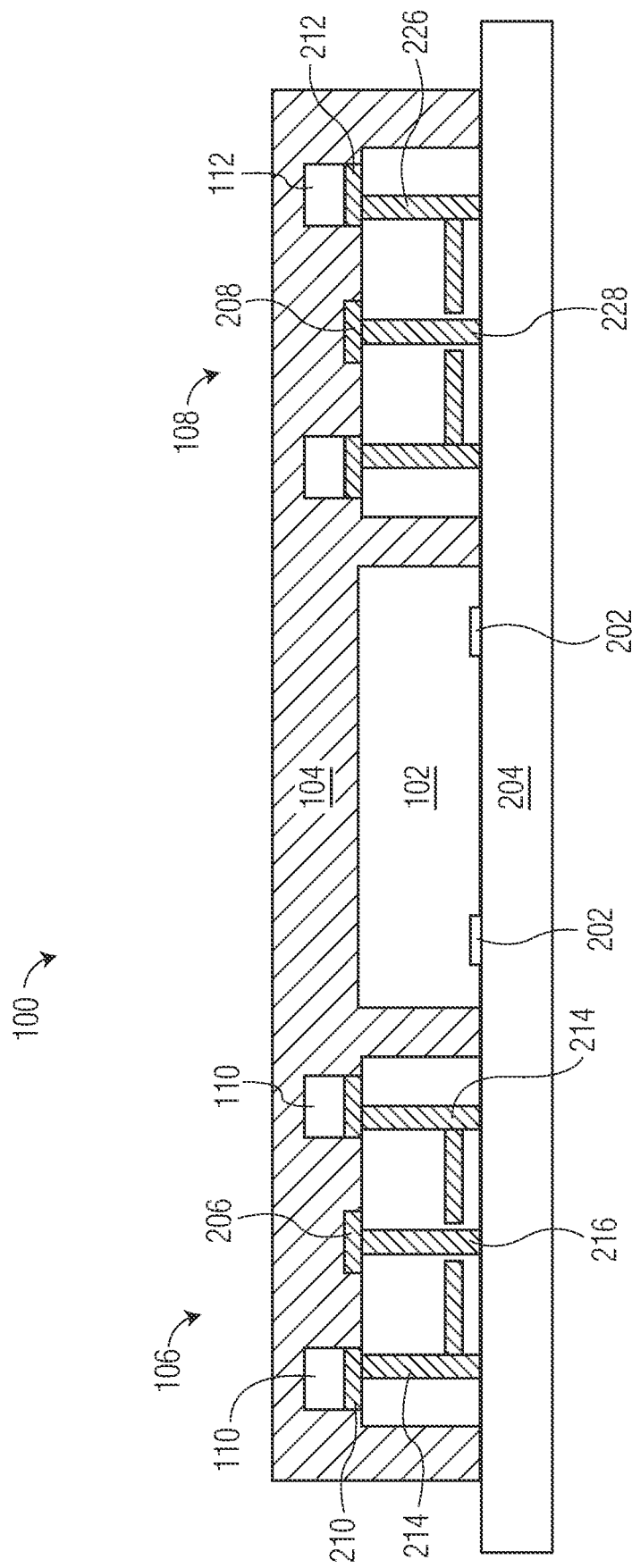

FIG. 3 illustrates, in a simplified cross-sectional view, the example semiconductor device 100 taken along line A-A at a subsequent stage of manufacture in accordance with an embodiment. At this stage, the semiconductor device 100 includes the semiconductor die 102 and the radiating element structures 106 and 108 at least partially encapsulated with the encapsulant 104 while temporarily affixed on the carrier substrate 204. In this embodiment, the semiconductor die 102 and radiating element structures 106 and 108 are over-molded with the encapsulant 104 by way of a molding process (e.g., injection molding).

Figure 4:
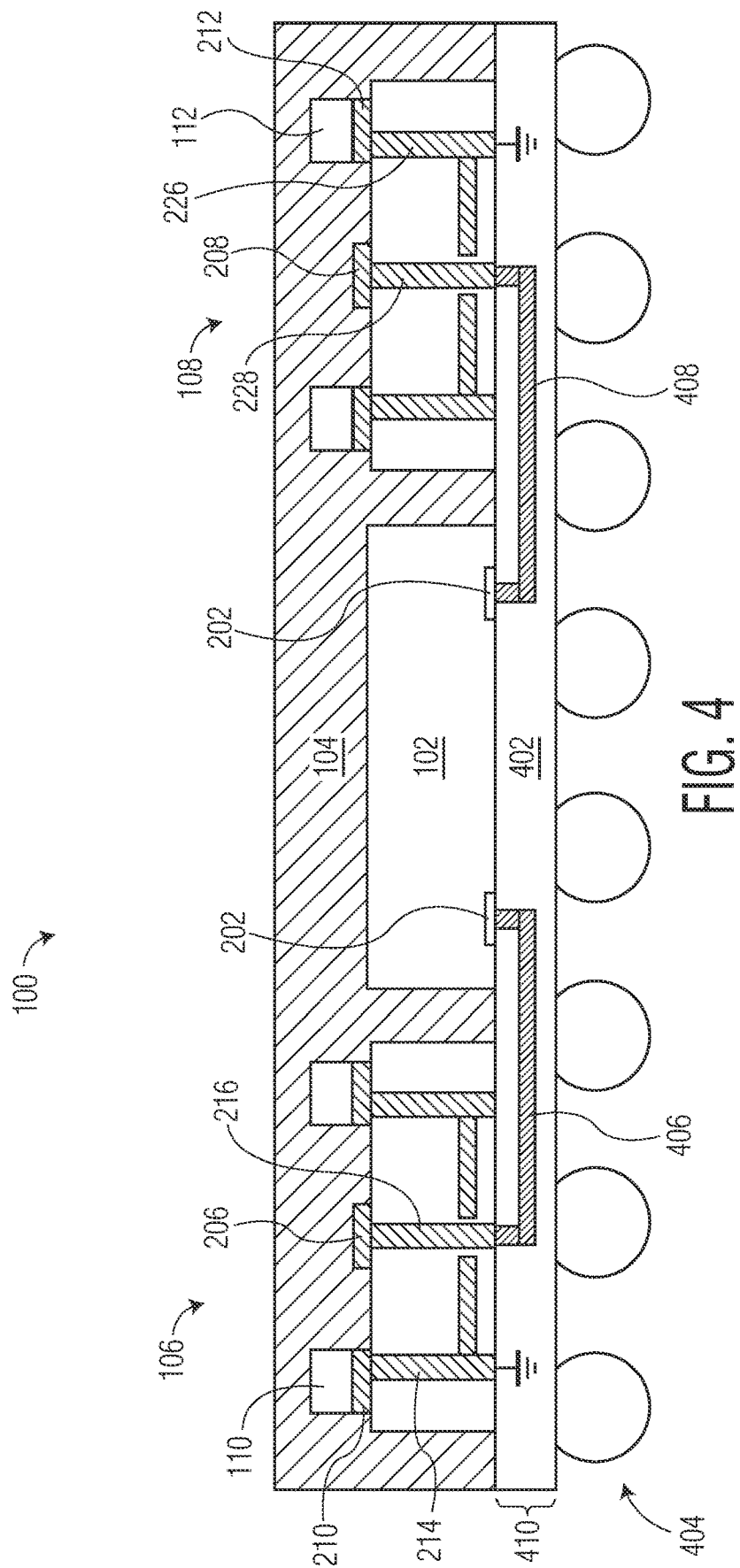

FIG. 4 illustrates, in a simplified cross-sectional view, the example semiconductor device 100 taken along line A-A at a subsequent stage of manufacture in accordance with an embodiment. At this stage, the at least partially encapsulated semiconductor die 102 and radiating element structures 106 and 108 are separated from the carrier substrate 204. After the carrier substrate 204 is removed, an interconnecting package substrate 410 is applied to the resulting exposed active side of the semiconductor die 102 and exposed bottom surfaces of the radiating element structures 106 and 108. The package substrate 410 includes conductive features (e.g., feeds 406 and 408) surrounded by non-conductive material 402. The package substrate 410 may be formed as a build-up substrate or may be provided as a pre-formed substrate. Conductive feeds 406 and 408 are formed in the package substrate 410 between bond pads 202 and vias 216 and 228 to interconnect semiconductor die 102 and respective radiating elements 206 and 208. The conductive vias 214 and 226 are interconnected to a ground voltage supply terminal (illustrated as a ground symbol) by way of the package substrate 410. After the package substrate 410 is applied, conductive connectors 404 (e.g., solder balls) are affixed to a bottom surface of the package substrate 410. The conductive connectors 404 are configured and arranged to provide conductive connections between the semiconductor device 100 and a printed circuit board (PCB), for example. The conductive connectors 404 may be in the form of any suitable conductive structures such as solder balls, gold studs, copper pillars, and the like, to connect conductive features of the semiconductor device 100 with the PCB.

Figure 5:
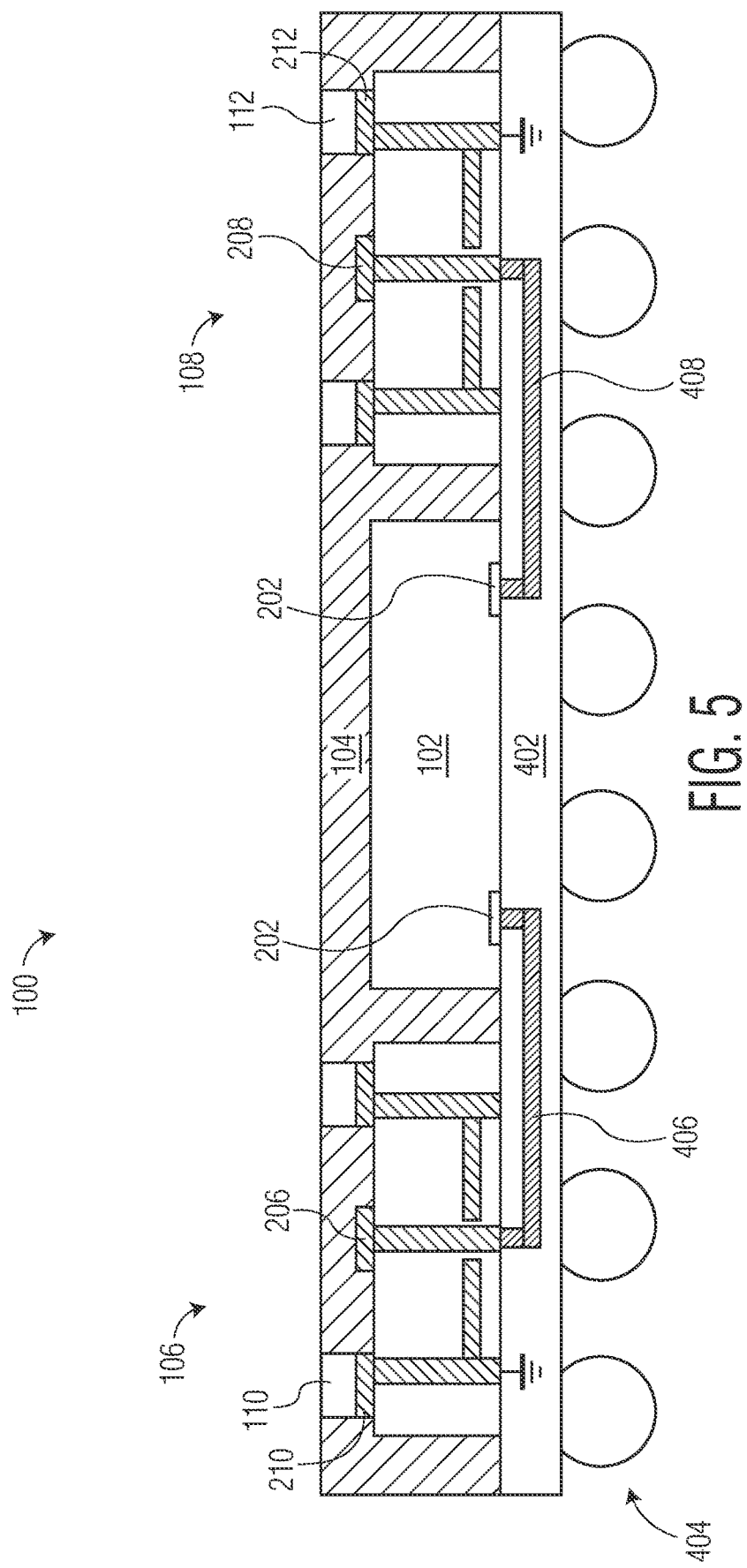

FIG. 5 illustrates, in a simplified cross-sectional view, the example semiconductor device 100 taken along line A-A at a subsequent stage of manufacture in accordance with an embodiment. At this stage, the semiconductor device 100 includes the encapsulant 104 at least partially encapsulating semiconductor die 102 and radiating element structures 106 and 108 with a top surface of the surrounding rings 110 and 112 exposed through the encapsulant. In this embodiment, the semiconductor device 100 is subjected to a topside grind operation to expose the top surface of the surrounding rings 110 and 112 of the radiating element structures 106 and 108. In other embodiments, other methods, techniques, or processes may be employed to expose top portions of the surrounding rings 110 and 112.

Figure 6:
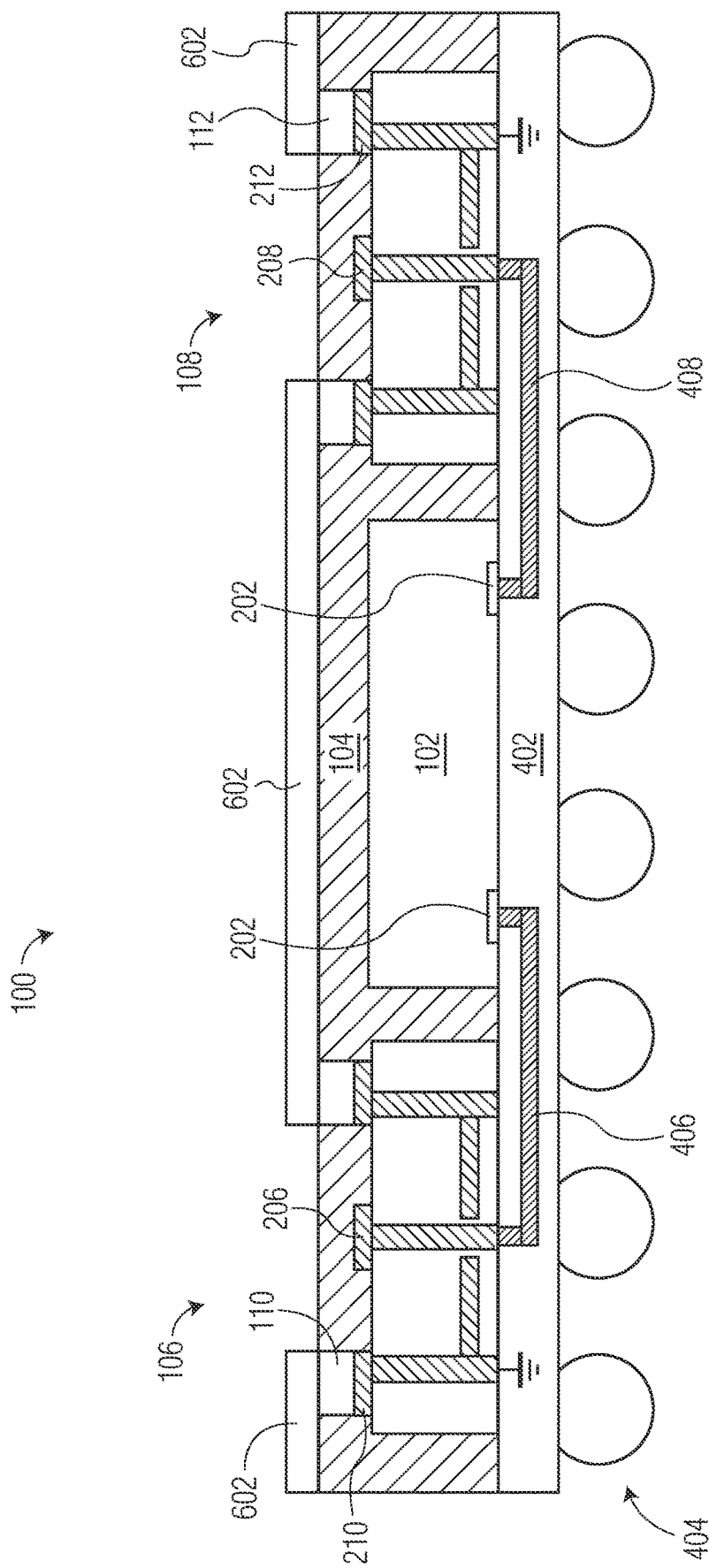

FIG. 6 illustrates, in a simplified cross-sectional view, the example semiconductor device 100 taken along line A-A at a subsequent stage of manufacture in accordance with an embodiment. At this stage, a waveguide interface material 602 is formed on at least a portion of the top surface of the semiconductor device 100. In this embodiment, the interface material 602 is in the form of a conductive adhesive material such as conductive epoxy, conductive silicone, conductive die attach film (DAF), and the like. The interface material 602 may be dispensed, deposited, or otherwise applied on the top surface of the semiconductor device 100 using suitable methods and techniques. The dispensed or deposited layer of interface material 602 may be patterned to form openings over the underlying radiating elements 206 and 208. Alternatively, the interface material 602 may be a preformed layer or patterned film applied to the top surface of the semiconductor device 100, for example. In some embodiments, the interface material may be applied to a bottom side of a waveguide structure. It is desirable for the interface material 602 to overlap at least a portion of the exposed surrounding rings 110 and 112 such that a substantially contiguous conductive channel is formed surrounding the respective radiating elements 206 and 208. The interface material 602 may be configured to have a layer thickness and pliability suitable for mechanical stress mitigation when a waveguide structure is attached by way of the interface material. The interface material 602 may further serve as thermal dissipation layer to accommodate thermal mitigation as desired.

Figure 7:
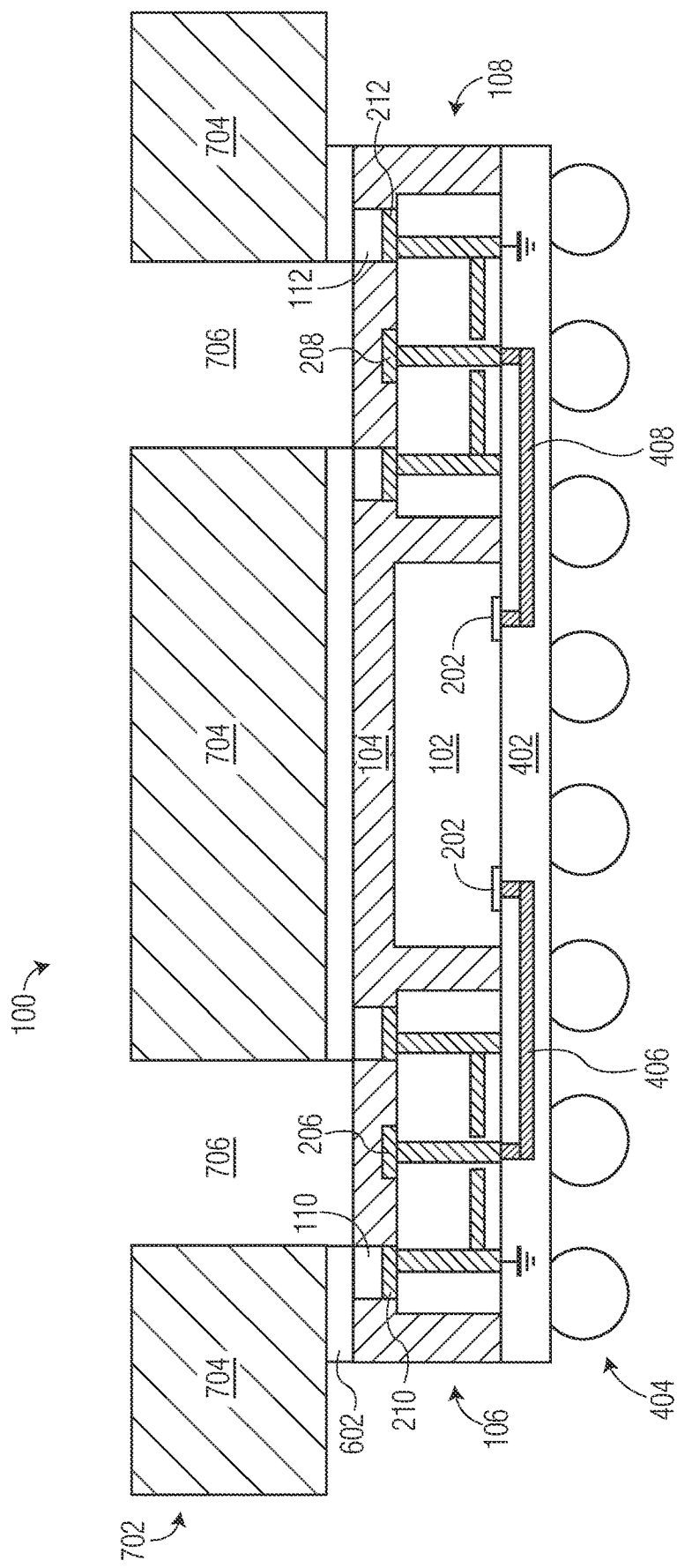

FIG. 7 illustrates, in a simplified cross-sectional view, the example semiconductor device 100 at a subsequent stage of manufacture in accordance with an embodiment. At this stage, a waveguide structure 702 is aligned and affixed to the top surface of the semiconductor device 100 by way of the waveguide interface material 602. In this embodiment, the waveguide structure 702 includes waveguides 706 formed in a waveguide body 704. For example, the waveguide body 704 may be formed from a metal, metal-coated plastic, or metal-coated laminate material with the waveguides 706 formed as air cavities. The waveguides 706 may be formed with a metal lining when the waveguide body 704 is formed from a non-conductive material, for example. With the waveguide structure 702 affixed to the top surface of the encapsulated semiconductor die 102 and radiating element structures 106 and 108 by way of the conductive waveguide interface material 602, a substantially contiguous conductive waveguide channel is formed from the radiating element structures 106 and 108 through the waveguide structure 702. Because a substantially contiguous conductive waveguide channel is formed, RF signal radiation is prevented from propagating laterally thus minimizing signal loss in the intended vertical propagation path.

Figure 8:
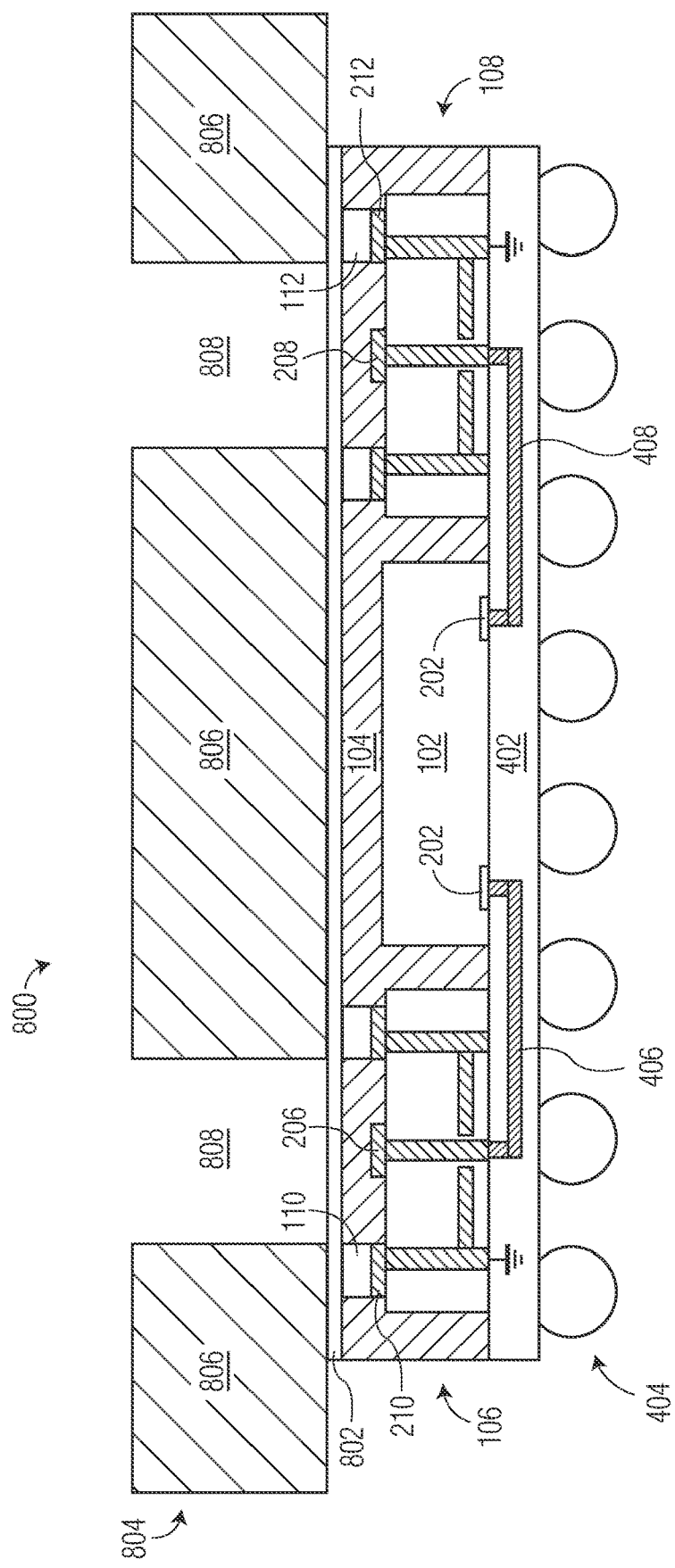
FIG. 8 illustrates, in a simplified cross-sectional view, an alternative example semiconductor device having a low loss waveguide interface in accordance with an embodiment.

FIG. 8 illustrates, in a simplified cross-sectional view, an alternative example semiconductor device 800 having a low loss waveguide interface at a stage of manufacture in accordance with an embodiment. The stage of manufacture depicted in FIG. 8 is an alternative to the stages of manufacture depicted in FIG. 6 and FIG. 7, with stages of manufacture depicted in FIG. 2 through FIG. 5 remaining the same. At this stage, a waveguide structure 804 is aligned and affixed to the top surface of the semiconductor device 800 by way of a waveguide interface material 802.

In this embodiment, the waveguide interface material 802 may be applied on the top surface of the encapsulated semiconductor die 102 and radiating element structures 106 and 108 or may be applied on the bottom surface of the waveguide structure 804 before the waveguide structure is affixed. In this embodiment, the interface material 802 is in the form of a non-conductive adhesive material such as non-conductive epoxy, non-conductive silicone, non-conductive DAF, and the like. It is desirable for the interface material 602 to be configured as a very thin layer (e.g., 100 microns) to reduce RF signal loss at the waveguide interface. In some embodiments, it may be desirable for the interface material 602 to have a relative dielectric constant substantially similar to that of the encapsulant 104.

In this embodiment, the waveguide structure 804 includes waveguides 808 formed in a waveguide body 806. With the waveguide structure 804 affixed to the top surface of the encapsulated semiconductor die 102 and radiating element structures 106 and 108 by way of the non-conductive waveguide interface material 802, a minimal non-conductive portion of a waveguide channel formed from the radiating element structures 106 and 108 through the waveguide structure 804 remains. Because the minimal non-conductive portion exists in the formed waveguide channel, RF signal radiation is reduced from propagating laterally thus reducing signal loss in the intended vertical propagation path.

Figure 9:
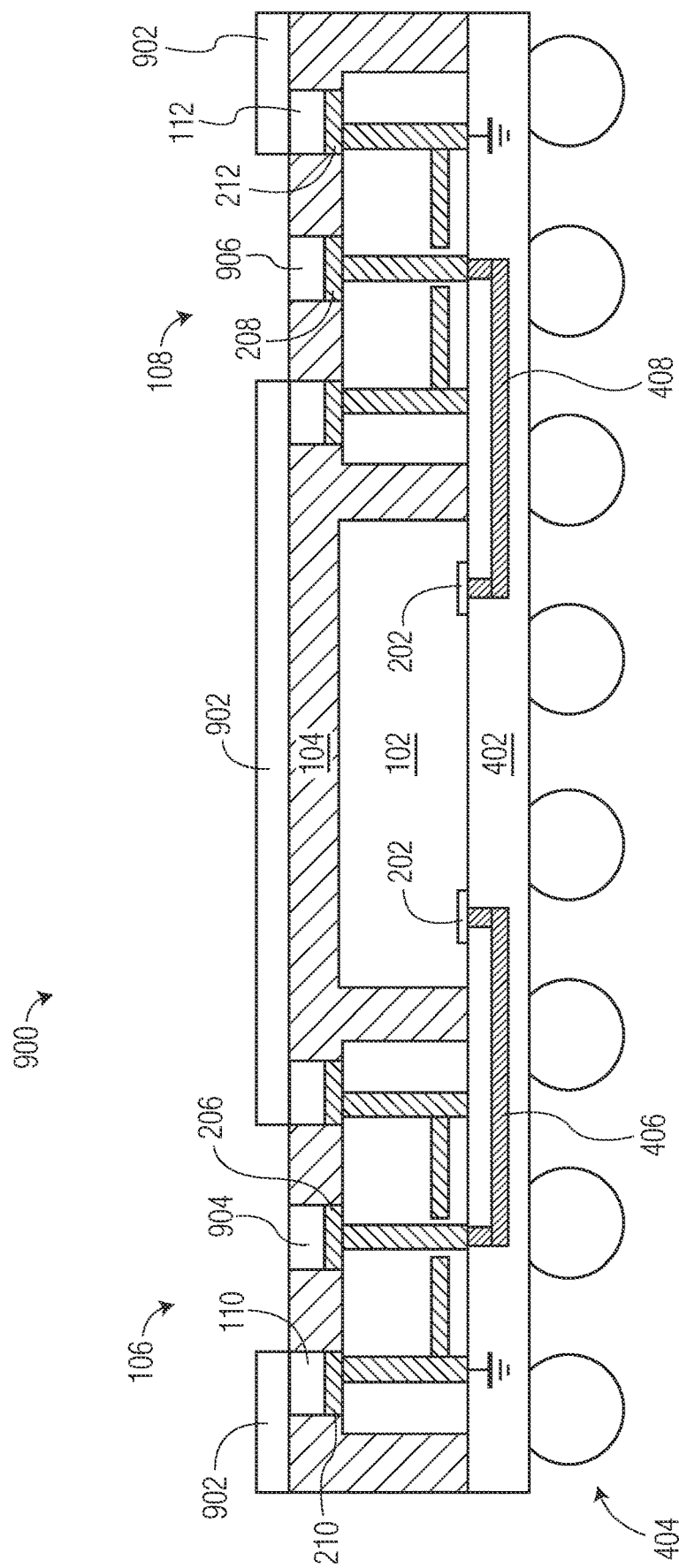
FIG. 9 illustrates, in a simplified cross-sectional view, another alternative example semiconductor device having a low loss waveguide interface in accordance with an embodiment.

FIG. 9 illustrates, in a simplified cross-sectional view, an alternative example semiconductor device 900 having a low loss waveguide interface at a stage of manufacture in accordance with an embodiment. The stage of manufacture depicted in FIG. 9 is an alternative to the stage of manufacture depicted in FIG. 6, with stages of manufacture depicted in FIG. 2 through FIG. 5 remaining the same. At this stage, a waveguide interface material 902 is formed on at least a portion of the top surface of the semiconductor device 900. The semiconductor device 900 includes the encapsulant 104 at least partially encapsulating semiconductor die 102 and radiating element structures 106 and 108 with a top surface of the radiating elements 904 and 906 and conductive surrounding rings 110 and 112 exposed through the encapsulant. The semiconductor device 900 is subjected to a topside grind operation to expose the top surface of the radiating elements 904 and 906 and surrounding rings 110 and 112 of the respective radiating element structures 106 and 108. In other embodiments, other methods, techniques, or processes may be employed to expose top portions of the radiating elements 904 and 906 and surrounding rings 110 and 112.

In this embodiment, the radiating elements of the radiating element structures 106 and 108 include conductive (e.g., metal) extended portions 904 and 906 formed on conductive base portions 206 and 208. Likewise, the surrounding rings of the radiating element structures 106 and 108 include conductive (e.g., metal) extended portions 110 and 112 formed on conductive base portions 210 and 212. The conductive extended portions 904-906 and 110-112 are configured to increase the effective height of the respective radiating elements and surrounding rings, for example.

After the semiconductor die 102 and the radiating element structures 106 and 108 are at least partially encapsulated with the encapsulant 104, the semiconductor device 900 is subjected to a topside grind operation to expose the top surface of the radiating elements 904 and 906 and surrounding rings 110 and 112 of the respective radiating element structures 106 and 108. In other embodiments, other methods, techniques, or processes may be employed to expose top portions of the radiating elements 904 and 906 and surrounding rings 110 and 112.

In this embodiment, the interface material 902 is in the form of a conductive adhesive material such as conductive epoxy, conductive silicone, conductive DAF, and the like. The interface material 902 may be dispensed, deposited, or otherwise applied on the top surface of the semiconductor device 900 using suitable methods and techniques. The dispensed or deposited layer of interface material 902 may be patterned to form openings over the exposed radiating elements 904 and 906. Alternatively, the interface material 902 may be a preformed layer or patterned film applied to the top surface of the semiconductor device 900, for example. It is desirable for the interface material 902 to overlap at least a portion of the exposed surrounding rings 110 and 112 such that a substantially contiguous conductive channel is formed surrounding the respective radiating elements 904 and 906.

Figure 10:
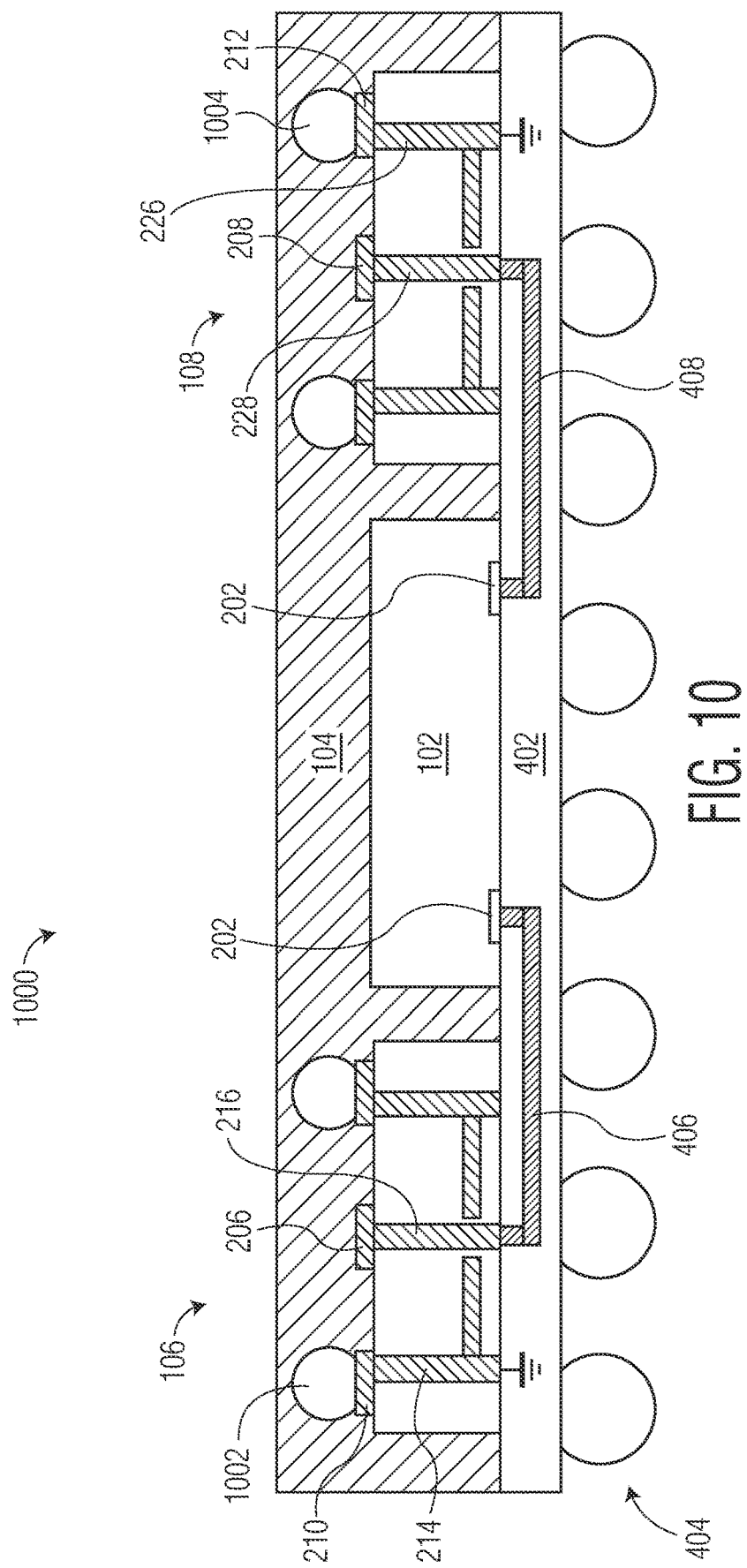
FIG. 10 through FIG. 12 illustrate, in simplified cross-sectional views, yet another alternative example semiconductor device having a low loss waveguide interface in accordance with an embodiment.

FIG. 10 illustrates, in a simplified cross-sectional view, an alternative example semiconductor device 1000 having a low loss waveguide interface at a stage of manufacture in accordance with an embodiment. The stage of manufacture depicted in FIG. 10 is an alternative to the stage of manufacture depicted in FIG. 4. At this stage, the surrounding rings of the radiating element structures 106 and 108 include conductive extended portions 1002 and 1004 formed as a series of solder balls or a substantially continuous solder ring on the conductive base portions 210 and 212. The conductive extended portions 1002 and 1004 are configured to increase the effective height of the respective surrounding rings, for example. As depicted in FIG. 10, the semiconductor die 102 and the radiating element structures 106 and 108 are at least partially encapsulated with the encapsulant 104.

Figure 11:
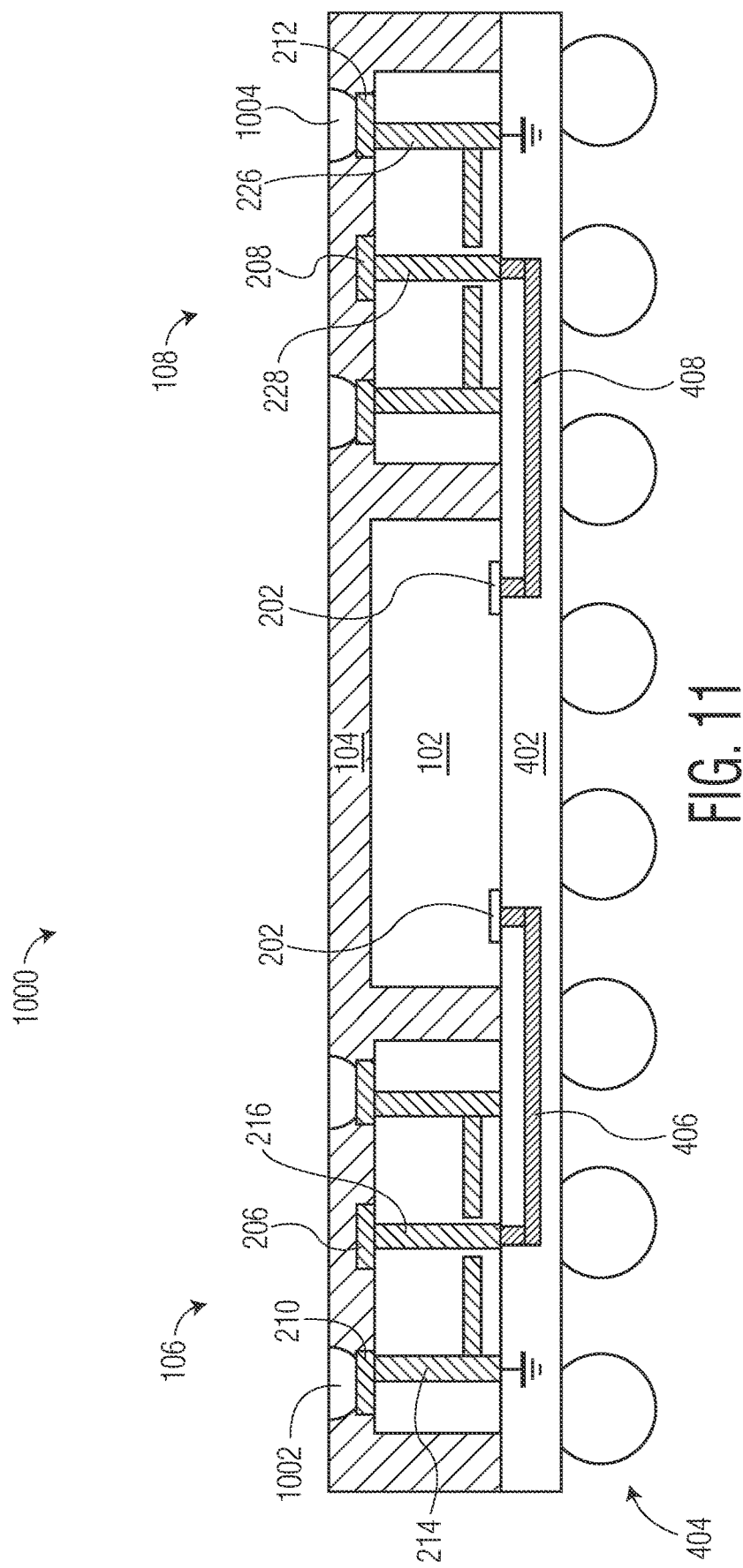

FIG. 11 illustrates, in a simplified cross-sectional view, the alternative example semiconductor device 1000 at a subsequent stage of manufacture in accordance with an embodiment. At this stage, the semiconductor device 1000 includes the encapsulant 104 at least partially encapsulating semiconductor die 102 and radiating element structures 106 and 108 with a portion of the surrounding rings 1002 and 1004 exposed through a top surface of the encapsulant. In this embodiment, the semiconductor device 1000 is subjected to a topside grind operation to expose a cross-sectional surface of the surrounding rings 1002 and 1004 of the radiating element structures 106 and 108. In other embodiments, other methods, techniques, or processes may be employed to expose top portions of the surrounding rings 1002 and 1004.

Figure 12:
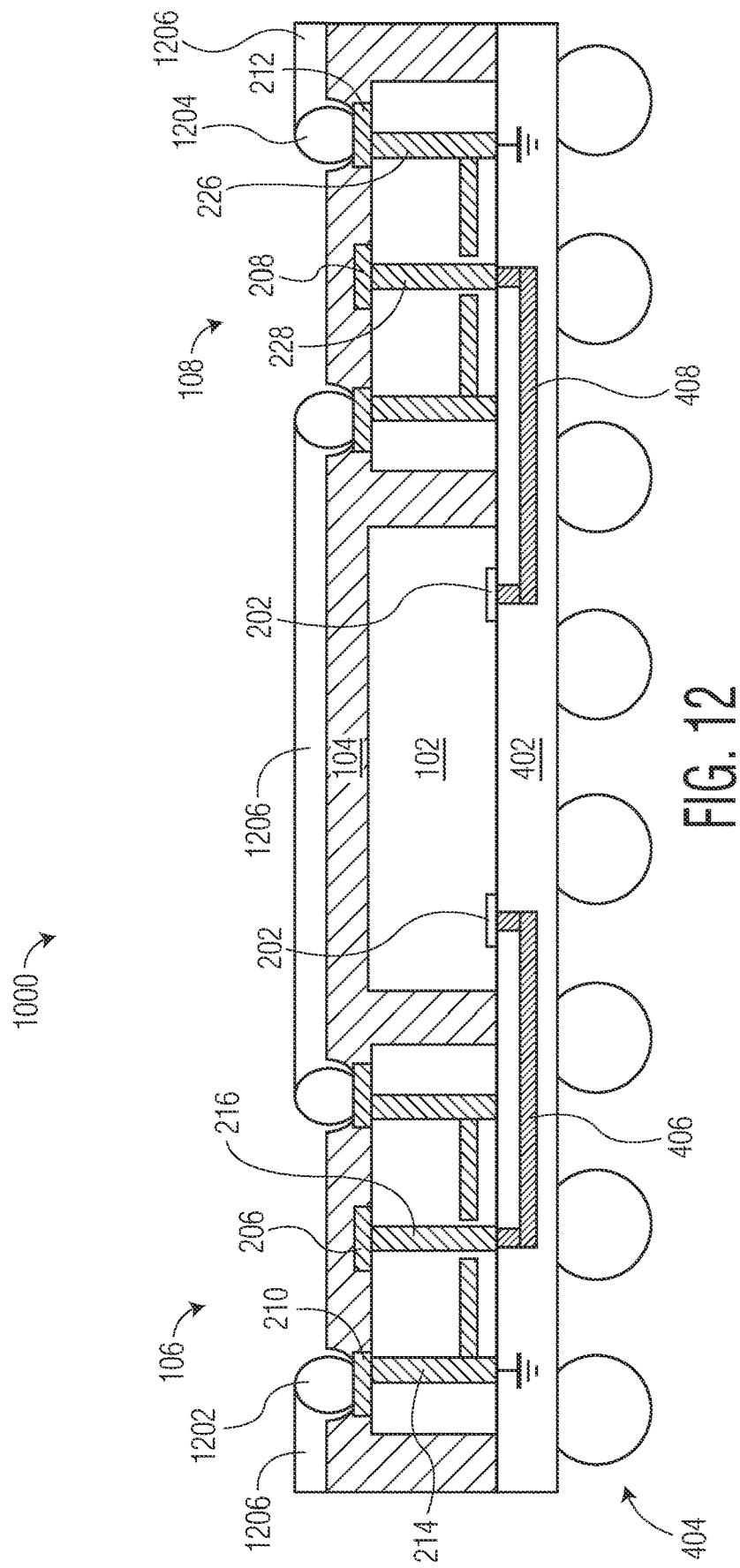

FIG. 12 illustrates, in a simplified cross-sectional view, the alternative example semiconductor device 1000 at a subsequent stage of manufacture in accordance with an embodiment. At this stage, the semiconductor device 1000 includes the encapsulant 104 at least partially encapsulating semiconductor die 102 and radiating element structures 106 and 108 with a portion of the surrounding rings 1202 and 1204 exposed at a top surface of the encapsulant. In this embodiment, the semiconductor device 1000 is subjected to a reflow operation to cause the remaining portions of the exposed surrounding rings (1002 and 1004) to reform as surrounding rings 1202 and 1204 having a portion of the somewhat smaller series of solder balls or substantially continuous solder ring extend above the top surface of the encapsulant 104.

After the surrounding rings 1202 and 1204 are reformed as depicted in FIG. 12, a waveguide interface material 1206 is formed on at least a portion of the top surface of the semiconductor device 1000. In this embodiment, the interface material 1206 is in the form of a conductive adhesive material such as conductive epoxy, conductive silicone, conductive DAF, and the like. The interface material 1206 may be dispensed, deposited, or otherwise applied on the top surface of the semiconductor device 1000 using suitable methods and techniques. The dispensed or deposited layer of interface material 1206 may be patterned to form openings over the underlying radiating elements 206 and 208. Alternatively, the interface material 1206 may be a preformed layer or patterned film applied to the top surface of the semiconductor device 1000, for example. It is desirable for the interface material 1206 to abut or overlap at least a portion of the exposed surrounding rings 1202 and 1204 such that a substantially contiguous conductive channel is formed surrounding the respective radiating elements 206 and 208.

Figure 13:
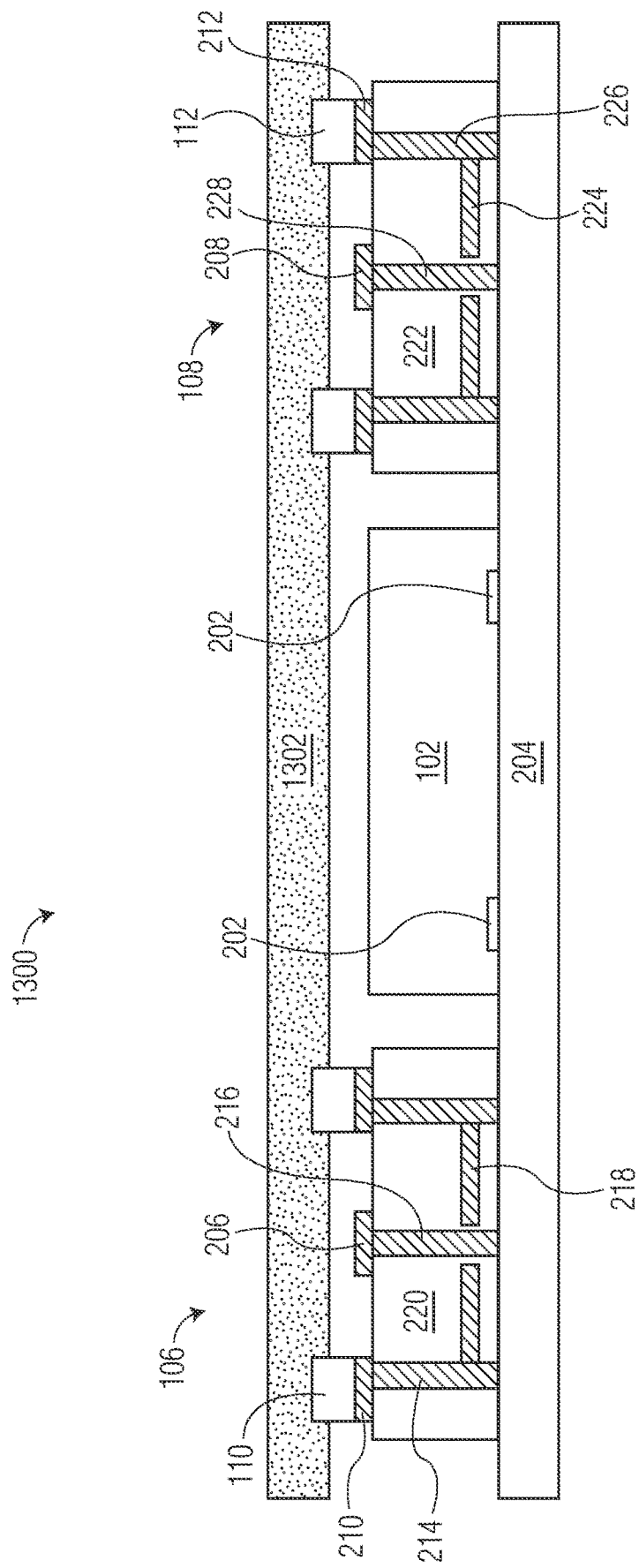
FIG. 13 and FIG. 14 illustrate, in simplified cross-sectional views, yet another alternative example semiconductor device having a low loss waveguide interface in accordance with an embodiment.
Figure 14:
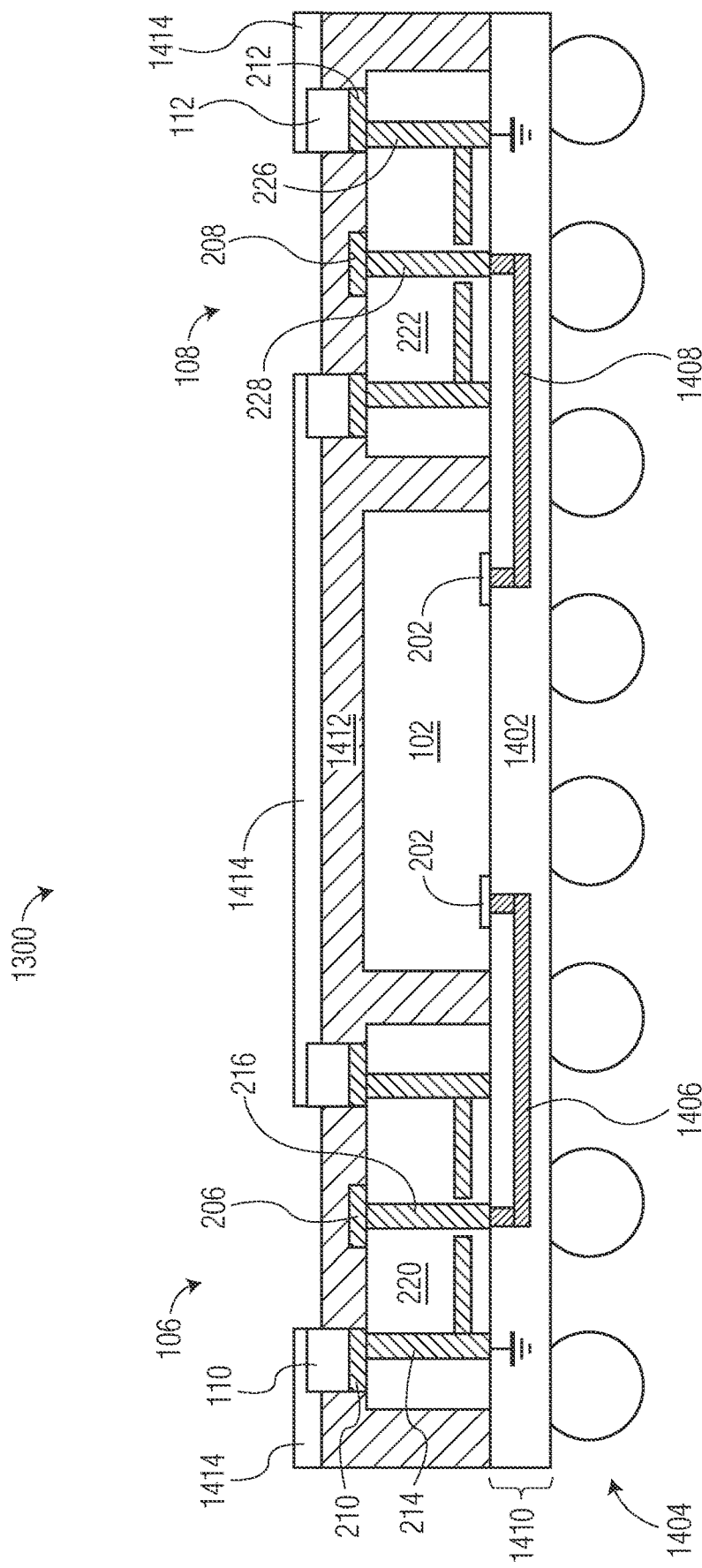

FIG. 13 illustrates, in a simplified cross-sectional view, another alternative example semiconductor device 1300 having a low loss waveguide interface at a stage of manufacture in accordance with an embodiment. The stages of manufacture depicted in FIG. 13 and FIG. 14 are an alternative to the stages of manufacture depicted in FIG. 3 though FIG. 6. At this stage, the semiconductor device 1300 includes the semiconductor die 102 and the radiating element structures 106 and 108 placed on a carrier substrate 204 and engaged with a film-assisted molding (FAM) tool 1302. In this embodiment, portions of the surrounding rings 110 and 112 extend into portions of the FAM tool 1302 during a FAM process.

FIG. 14 illustrates, in a simplified cross-sectional view, the alternative example semiconductor device 1300 at a subsequent stage of manufacture in accordance with an embodiment. At this stage, the semiconductor device 1300 includes the semiconductor die 102 and the radiating element structures 106 and 108 at least partially encapsulated with the encapsulant 1412 leaving a portion of surrounding rings 110 and 112 extending above a top surface of the encapsulant 1412. In this embodiment, the semiconductor die 102 and radiating element structures 106 and 108 are over-molded with the encapsulant 104 by way of a FAM process.

After the carrier substrate (204) is removed, an interconnecting package substrate 1410 is applied to the resulting exposed active side of the semiconductor die 102 and exposed bottom surfaces of the radiating element structures 106 and 108. The package substrate 1410 includes conductive features (e.g., feeds 1406 and 1408) surrounded by non-conductive material 1402. The package substrate 1410 may be formed as a build-up substrate or may be provided as a pre-formed substrate. Conductive feeds 1406 and 1408 are formed in the package substrate 1410 between bond pads 202 and vias 216 and 228 to interconnect semiconductor die 102 and respective radiating elements 206 and 208. The conductive vias 214 and 226 are interconnected to a ground voltage supply terminal (illustrated as a ground symbol) by way of the package substrate 1410. After the package substrate 1410 is applied, conductive connectors 1404 (e.g., solder balls) are affixed to a bottom surface of the package substrate 1410. The conductive connectors 1404 are configured and arranged to provide conductive connections between the semiconductor device 1300 and a PCB, for example.

A waveguide interface material 1414 is formed on at least a portion of the top surface of the semiconductor device 1300. In this embodiment, the interface material 1414 is in the form of a conductive adhesive material such as conductive epoxy, conductive silicone, conductive DAF, and the like. The interface material 1414 may be dispensed, deposited, or otherwise applied on the top surface of the semiconductor device 100 using suitable methods and techniques. The dispensed or deposited layer of interface material 1414 may be patterned to form openings over the underlying radiating elements 206 and 208. Alternatively, the interface material 1414 may be a preformed layer or patterned film applied to the top surface of the semiconductor device 1300, for example. It is desirable for the interface material 1414 to overlap at least a portion of the exposed surrounding rings 110 and 112 such that a substantially contiguous conductive channel is formed surrounding the respective radiating elements 206 and 208.

Figure 15:
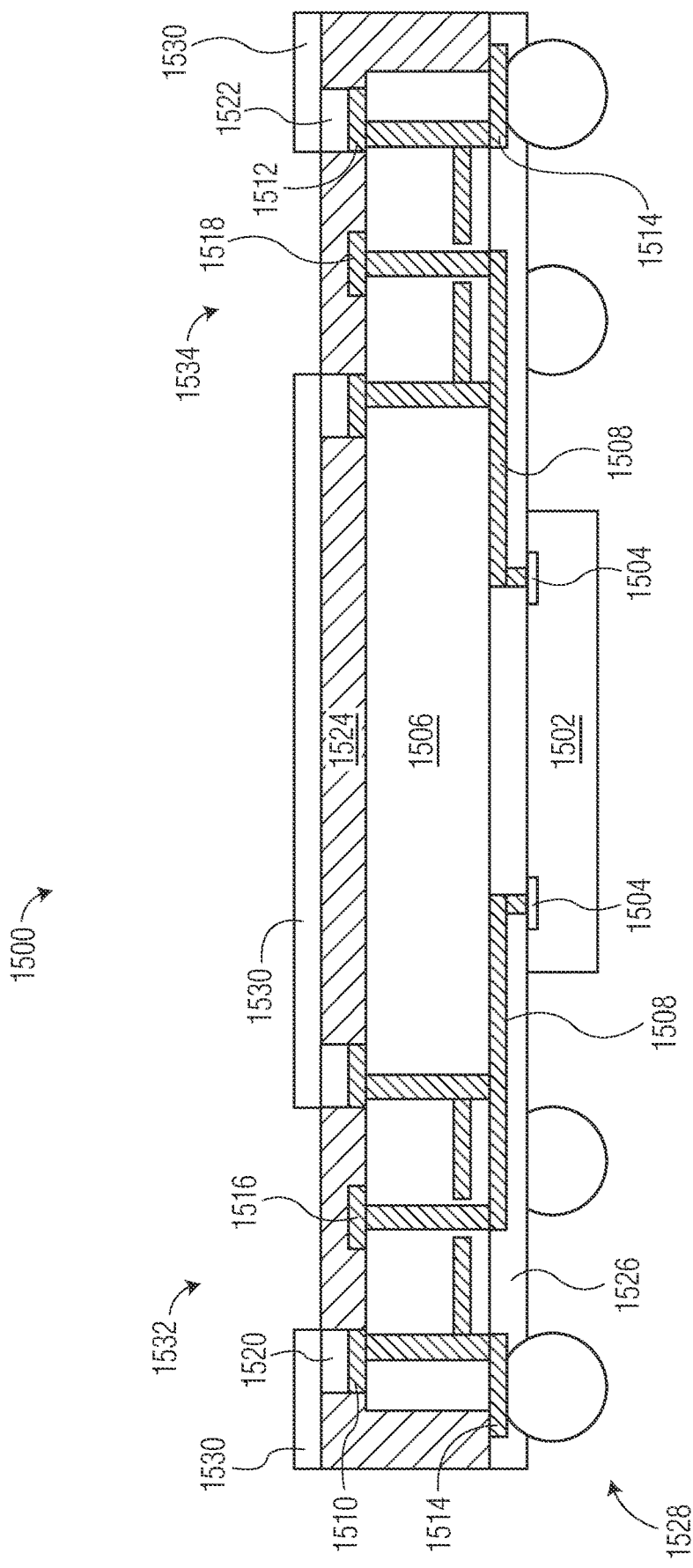
FIG. 15 illustrates, in a simplified cross-sectional view, yet another alternative example semiconductor device having a low loss waveguide interface in accordance with an embodiment.

FIG. 15 illustrates, in a simplified cross-sectional view, yet another alternative example semiconductor device 1500 having a low loss waveguide interface at a stage of manufacture in accordance with an embodiment. At this stage, the semiconductor device 1500 includes a semiconductor die 1502 affixed at a bottom side of a non-conductive substrate 1506 in an active-side-up configuration. In this embodiment, radiating element structures 1532 and 1534 are integrated in the substrate 1506.

The radiating element structures 1532 and 1534 include conductive radiating elements (e.g., signal launcher, antenna) 1516 and 1518 with conductive surrounding rings 1510 and 1512 formed at a top surface of the non-conductive substrate 1506. The surrounding rings 1510 and 1512 of the radiating element structures 1532 and 1534 include conductive (e.g., metal) extended portions 1520 and 1522 formed on respective conductive base portions 1510 and 1512. The conductive extended portions 1520 and 1522 are configured to increase the effective height of the of the surrounding rings, for example. The radiating element structures 1532 and 1534 further include horizontal conductive (e.g., metal) plates that serve as signal reflectors interconnected with respective surrounding rings 1510 and 1512 by way of conductive vias. The conductive vias are configured and arranged to form a vertical conductive structure (e.g., wall, fence) substantially surrounding each of the respective radiating elements 1516 and 1518 and interconnecting vias. The substrate 1506 may be formed from suitable non-conductive materials such as laminate (e.g., Bismaleimide Triazine, FR4), ceramic, glass, and the like.

The semiconductor die 1502 has an active side (e.g., major side having circuitry) and a backside (e.g., major side opposite of the active side). The semiconductor die 1502 includes bond pads 1504 formed at the active side and configured for connection to the respective radiating elements 1516 and 1518 by way of the interconnecting vias and conductive feeds 1508, for example. In this embodiment, semiconductor die 1502 is configured in an active-side-up orientation with the active side affixed at the bottom side of the substrate 1506. The semiconductor die 1502 may be formed from any suitable semiconductor material, such as silicon, germanium, gallium arsenide, gallium nitride, and the like. The semiconductor die 1502 further includes any digital circuits, analog circuits, RF circuits, memory, processor, the like, and combinations thereof at the active side.

The radiating element structures 1532 and 1534 including substrate 1506 are at least partially encapsulated with an encapsulant 1524. A top surface of the extended portions 1520 and 1522 of the surrounding rings are exposed through the encapsulant 1524 by way of a topside grind operation or other suitable methods, techniques, or processes. After the top surface of the extended portions 1520 and 1522 of the surrounding rings are exposed, a waveguide interface material 1530 is dispensed, deposited, or otherwise applied on the top surface of the semiconductor device 1500 using suitable methods and techniques. In this embodiment, the interface material 1530 is in the form of a conductive adhesive material such as conductive epoxy, conductive silicone, conductive DAF, and the like. The interface material 1530 may be patterned to form openings over the underlying radiating elements 1516 and 1518. Alternatively, the interface material 1530 may be a preformed layer or patterned film applied to the top surface of the semiconductor device 1500, for example. It is desirable for the interface material 1530 to overlap at least a portion of the exposed surrounding rings extended portions 1520 and 1522 such that a substantially contiguous conductive channel is formed surrounding the respective radiating elements 1516 and 1518.

Conductive connectors 1528 (e.g., solder balls) are affixed to a bottom side of the substrate 1506. A non-conductive material 1526 is formed at the bottom side of the substrate 1506 and patterned to provide substrate pad openings for conductive connectors 1528. The conductive connectors 1528 are configured and arranged to provide conductive connections between the semiconductor device 1500 and a PCB, for example. The conductive connectors 1528 may be in the form of any suitable conductive structures such as solder balls, gold studs, copper pillars, and the like, to connect conductive features of the semiconductor device 1500 with the PCB. In this embodiment, substrate pads 1514 are connected to the vertical conductive structures interconnected with respective surrounding rings 1510 and 1512. The substrate pads 1514 are configured to provide a connection to a ground voltage supply terminal by way of the conductive connectors, for example.

Generally, there is provided, a method including providing a radiating element structure, the radiating element structure comprising: a non-conductive substrate; a radiating element formed at a top side of the non-conductive substrate; and a conductive ring formed at the top side of the non-conductive substrate, the conductive ring substantially surrounding the radiating element; providing a semiconductor die; encapsulating with an encapsulant at least a portion of the radiating element structure, a top surface of the conductive ring exposed at a top surface of the encapsulant; interconnecting the semiconductor die with the radiating element by way of a conductive trace; and applying a waveguide interface material on at least a portion of the top surface of the encapsulant. The method may further include patterning the waveguide interface material to form an opening over the radiating element. The waveguide interface material may be characterized as a conductive adhesive material. At least a portion of the waveguide interface material may overlap at least a portion of the conductive ring. The method may further include placing the radiating element structure and the semiconductor die on a carrier substrate before encapsulating with the encapsulant. The method may further include grinding the top surface of the encapsulant to expose the conductive ring. The conductive ring may include a conductive extended portion formed on a conductive base portion of the conductive ring, the conductive extended portion configured to increase the height of the of the conductive ring. The radiating element structure may further include forming a vertical conductive fence connected to the conductive ring, the vertical conductive fence substantially surrounding a via connected to the radiating element. The radiating element structure may further include forming a horizontal conductive plate connected to the conductive fence, the horizontal conductive plate configured to serve as a signal reflector.

In another embodiment, there is provided, a semiconductor device including a radiating element structure comprising: a non-conductive substrate; a radiating element formed at a top side of the non-conductive substrate; and a conductive ring formed at the top side of the non-conductive substrate, the conductive ring substantially surrounding the radiating element; a semiconductor die having a bond pad interconnected to the radiating element by way of a conductive trace; an encapsulant encapsulating at least a portion of the radiating element structure, a top surface of the conductive ring exposed at a top surface of the encapsulant; and a waveguide interface material applied on at least a portion of the top surface of the encapsulant. At least a portion of the waveguide interface material may overlap at least a portion of the conductive ring. The waveguide interface material may be characterized as a conductive adhesive material. The encapsulant may further encapsulate the radiating element of the radiating element structure. The conductive ring may include a conductive extended portion formed on a conductive base portion, the conductive extended portion configured to increase the height of the of the conductive ring higher than the radiating element. The conductive ring may extend above the top surface of the encapsulant.

In yet another embodiment, there is provided, a semiconductor device including a radiating element structure comprising: a non-conductive substrate; a radiating element formed at a top side of the non-conductive substrate; and a conductive ring formed at the top side of the non-conductive substrate, the conductive ring substantially surrounding the radiating element; a semiconductor die having a bond pad interconnected with the radiating element by way of a conductive trace; an encapsulant encapsulating at least a portion of the radiating element structure, a top surface of the conductive ring exposed at a top surface of the encapsulant; and a waveguide interface material applied on at least a portion of the top surface of the encapsulant, an opening in the waveguide interface material formed over the radiating element. At least a portion of the waveguide interface material may overlap at least a portion of the conductive ring. The waveguide interface material may be characterized as a conductive adhesive material. The encapsulant may further encapsulate at least a portion of the semiconductor die. The conductive trace interconnecting the bond pad of the semiconductor die with the radiating element may be formed at least in part in a package redistribution layer.

By now, it should be appreciated that there has been provided a semiconductor device with a low loss waveguide interface. The semiconductor device includes a semiconductor die and one or more radiating element structures at least partially encapsulated with an encapsulant. Each of the one or more radiating element structures includes a radiating element and a conductive surrounding ring substantially surrounding the radiating element. A top portion of the surrounding rings of the radiating element structures is extended and exposed at a top surface of the encapsulant. A waveguide interface material is formed over the top surface of the semiconductor device such that a substantially contiguous conductive waveguide channel is formed surrounding respective radiating elements. When a waveguide structure is affixed to the semiconductor device, the substantially contiguous conductive waveguide channel extends from the one or more radiating element structures through the waveguide structure. By forming the substantially contiguous conductive waveguide channel in this manner, RF signal radiation is prevented from propagating laterally thus minimizing signal loss in the intended vertical signal propagation path.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of manufacturing a semiconductor device, the method comprising:
   providing a radiating element structure, the radiating element structure comprising:
   a non-conductive substrate;
   a radiating element formed at a top side of the non-conductive substrate; and
   a conductive ring formed at the top side of the non-conductive substrate, the conductive ring substantially surrounding the radiating element;
   providing a semiconductor die;
   encapsulating with an encapsulant at least a portion of the top side of the non-conductive substrate and at least a portion of the radiating element structure, wherein the encapsulant contacts the conductive ring and a top surface of the conductive ring is exposed through a top surface of the encapsulant;
   interconnecting a bondpad of the semiconductor die with the radiating element by way of a conductive trace; and
   applying a waveguide interface material on at least a portion of the top surface of the encapsulant.

2. The method of claim 1, wherein the waveguide interface material is characterized as a conductive adhesive material.

3. The method of claim 1, wherein at least a portion of the waveguide interface material overlaps at least a portion of the conductive ring.

4. The method of claim 1, further comprising placing the radiating element structure and the semiconductor die on a carrier substrate before encapsulating with the encapsulant.

5. A semiconductor device comprising:
   a radiating element structure comprising:
   a non-conductive substrate;
   a radiating element formed at a top side of the non-conductive substrate; and
   a conductive ring formed at the top side of the non-conductive substrate, the conductive ring substantially surrounding the radiating element;
   a semiconductor die having a bond pad interconnected to the radiating element by way of a conductive trace;
   an encapsulant encapsulating at least a portion of the top side of the non-conductive substrate and at least a portion of the radiating element structure, wherein the encapsulant contacts the conductive ring, and a top surface of the conductive ring is exposed through a top surface of the encapsulant; and
   a waveguide interface material applied on at least a portion of the top surface of the encapsulant.

6. The semiconductor device of claim 5, wherein at least a portion of the waveguide interface material overlaps at least a portion of the conductive ring.

7. The semiconductor device of claim 5, wherein the waveguide interface material is characterized as a conductive adhesive material.

8. The semiconductor device of claim 5, wherein the encapsulant further encapsulates the radiating element of the radiating element structure.

9. The semiconductor device of claim 5, wherein the conductive ring includes a conductive extended portion formed on a conductive base portion, the conductive extended portion configured to increase a height of the of the conductive ring higher than a height of the radiating element.

10. The semiconductor device of claim 5, wherein the conductive ring extends above the top surface of the encapsulant.

11. A semiconductor device comprising:
    a radiating element structure comprising:
    a non-conductive substrate;
    a radiating element formed at a top side of the non-conductive substrate; and
    a conductive ring formed at the top side of the non-conductive substrate, the conductive ring substantially surrounding the radiating element;

a semiconductor die having a bond pad interconnected with the radiating element by way of a conductive trace;

an encapsulant encapsulating at least a portion of the top side of the non-conductive substrate and at least a portion of the radiating element structure, wherein the encapsulant contacts the conductive ring, and a top surface of the conductive ring is exposed through a top surface of the encapsulant; and a waveguide interface material applied on at least a portion of the top surface of the encapsulant, an opening in the waveguide interface material formed over the radiating element.

12. The semiconductor device of claim 11, wherein at least a portion of the waveguide interface material overlaps at least a portion of the conductive ring.

13. The semiconductor device of claim 11, wherein the waveguide interface material is characterized as a conductive adhesive material.

14. The semiconductor device of claim 11, wherein the encapsulant further encapsulates at least a portion of the semiconductor die.

15. The semiconductor device of claim 10, further comprising:

a package redistribution layer, wherein the radiating element structure element and the semiconductor die are coupled to the package redistribution layer, and the conductive trace interconnecting the bond pad of the semiconductor die with the radiating element is formed at least in part in the package redistribution layer.

16. The semiconductor device of claim 5, wherein the radiating element structure further comprises:

a horizontal conductive plate coupled to the conductive fence, the horizontal conductive plate configured to serve as a signal reflector.

17. The semiconductor device of claim 5, wherein the waveguide interface material contacts the top surface of the conductive ring.

18. The semiconductor device of claim 5, wherein the top surface of the conductive ring is coplanar with a top surface of the encapsulant.

19. The semiconductor device of claim 5, wherein the conductive ring and the waveguide interface material form a substantially contiguous conductive channel surrounding the radiating element.

20. The semiconductor device of claim 5, wherein the waveguide interface material is a non-conductive material selected from a group consisting of a non-conductive epoxy, a non-conductive silicon, and a non-conductive die attach film.

* * * * *